United States Patent
Cabral, Jr. et al.

(10) Patent No.: US 6,436,823 B1
(45) Date of Patent: Aug. 20, 2002

(54) METHOD FOR FORMING A TIN LAYER ON TOP OF A METAL SILICIDE LAYER IN A SEMICONDUCTOR STRUCTURE AND STRUCTURE FORMED

(75) Inventors: Cyril Cabral, Jr., Ossining; Chung-Ping Eng, Hopewell Junction; Lynne Marie Gignac, Beacon; Christian Lavoie, Ossining; Patricia O'Neil, Wappingers Falls, all of NY (US); Kirk David Peterson, Essex Junction, VT (US); Tina Wagner, Newburgh, NY (US); Yun-Yu Wang, Poughquag, NY (US); Keith Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 09/679,738

(22) Filed: Oct. 5, 2000

(51) Int. Cl.$^7$ .............................. H01L 21/44
(52) U.S. Cl. ............. 438/686; 438/570; 438/637; 438/653; 438/680; 257/384
(58) Field of Search ................. 438/686, 680, 438/570, 637, 653; 257/384

(56) References Cited

U.S. PATENT DOCUMENTS

| | | | | |
|---|---|---|---|---|
| 4,829,024 A | * | 5/1989 | Klein et al. ................. 437/189 |
| 5,468,662 A | * | 11/1995 | Havemann .................... 437/40 |
| 5,597,745 A | * | 1/1997 | Byun et al. .................... 437/41 |
| 6,187,617 B1 | * | 2/2001 | Gauthier Jr. et al. ....... 438/197 |
| 6,326,668 B1 | * | 12/2001 | Li .............................. 257/384 |

* cited by examiner

*Primary Examiner*—Richard Elms
*Assistant Examiner*—Pho M. Luu
(74) *Attorney, Agent, or Firm*—Robert M. Trepp; Randy W. Tung

(57) ABSTRACT

A method for forming a TiN layer on top of a metal silicide layer in a semiconductor structure without the formation of a thick amorphous layer containing Ti, Co and Si and the structure formed are provided. In the method, after a Ti layer is deposited on top of a metal silidide layer, a dual-step annealing process is conducted in which a low temperature annealing in a forming gas (or ammonia) at a temperature not higher than 500° C. is first conducted for less than 2 hours followed by a high temperature annealing in a nitrogen-containing gas (or ammonia) at a second temperature not lower than 500° for less than 2 hours to form the TiN layer. The present invention method prevents the problem usually caused by a thick amorphous material layer of Ti—Si—Co which produces weakly bonded Ti which reacts with fluorine atoms from $WF_6$ during a subsequent CVD W deposition process and causes liner failure due to a volume expansion of the amorphous material. The maximum thickness of the amorphous material layer formed by the present invention method is less than 5 nm which minimizes the line failure problem.

17 Claims, 2 Drawing Sheets

| Annealing temperature and time | Thickness of amorphous layer |
|---|---|
| 400C for 30 min. and 600C for 30 min. | 8.1 nm |
| 450C for 30 min. and 600C for 30 min. | 6.0 nm |
| 500C for 30 min. and 600C for 30 min. | 3.2 nm |
| 600C for 30 min. | 8.0 nm |
| 550C for 30 min. | 5.6 nm |

METHOD FOR FORMING A TIN LAYER ON TOP OF A METAL SILICIDE LAYER IN A SEMICONDUCTOR STRUCTURE AND STRUCTURE FORMED

FIELD OF THE INVENTION

The present invention generally relates to a method for fabricating a semiconductor structure and more particularly, relates to a method for forming a TiN layer on a metal silicide layer in a semiconductor structure and a structure formed by the method.

BACKGROUND OF THE INVENTION

In CMOS structures, silicides ($TiSi_2$ or $CoSi_2$) are used as contacts to the active regions as well as for conductive paths between regions of separate devices. In the contact region, a barrier is normally deposited on the silicide in a contact hole to prevent metal and Si inclusion to F attack during the subsequent W deposition from $WF_6$. A barrier layer can be formed by depositing Ti on top of the silicide ($CoSi_2$) at the bottom of the contact hole and annealing in $N_2/H_2$ or $NH_3$ gas at a temperature between 550° C. and 600° C. to ensure the formation of a TiN or TiON barrier on top of the silicide.

In order to get enough Ti into the bottom of the hole (on top of silicide) of the contacts with higher aspect ratios, ionized metal plasma (IMP) deposition is used. A thick Ti film on top of the silicide ensures better coverage of the barrier layer and reduces the chance of any pin hole in the barrier. However, it was discovered that when a thick (30–60 nm) Ti layer was deposited on top of the silicide layer and annealed at temperatures above 500° C., Ti reacted with $CoSi_2$ to form an amorphous material between TiON and $COSi_2$. The amorphous material contains primarily Ti, Co and Si. The weakly bonded Ti in the amorphous layer can react with fluorine in—$WF_6$ during the CVD W deposition and form a volatile compound. This volatile compound causes a volume expansion and subsequently results in a barrier liner rupture. The liner rupture exposes the silicide to F attack during CVD $WF_6$ deposition. This failure mechanism results in an electric open in the W studs.

In addition to the reaction with fluorine, the thick amorphous layer between TiON and $CoSi_2$ also causes consumption of silicon, which results in a shifting of the silicide layer deeper into the P-well or N-well. The shifting of silicide in to the P or N-well could cause junction leakage.

Due to the consequences of the reaction between F and the amorphous material that contains Ti, Co and Si, it is desirable to either eliminate the formation of the amorphous material layer or to reduce the thickness of the amorphous layer in order to decrease the risk of fluorine attack. TEM (Transmission Electron Microscopy) results on a n as-deposited 35 nm thick Ti film on $CoSi_2$ after various annealing treatments in forming gas indicated that a 6 nm thick amorphous layer is produced after annealing at 550° C. for 30 min, while an 8 nm thick amorphous layer is obtained after annealing at 600° C. for 30 min. For the 550° C. anneal, the TEM image further shows that Ti amorphizes the top surface of $CoSi_2$ to form a Ti—Co—Si layer. Neither of these thicknesses, i.e. 6 nm or 8 nm, is acceptable in a high aspect ratio CMOS device. In-situ x-ray diffraction results were obtained on as-deposited 35 nm Ti on $CoSi_2$ films after various annealing treatments in purified $N_2$. The data indicates a thickness reduction in $CoSi_2$ in contact with Ti as the temperature is increased during $N_2$ annealing treatments. This result is consistent with the TEM results which show an increased amorphous layer thickness after annealing.

Referring initially to FIG. 1, wherein a semiconductor structure 10 is prepared by a conventional method is shown. In structure 10, a silicon substrate 12 is shown. A native oxide layer 14 is formed on the surface of a metal silicide layer 16 of, for instance, cobalt silicide before the deposition of a titanium layer 18.

The as-deposited structure 10 is annealed using a conventional annealing method to produce the structure shown in FIG. 2. After single-step annealing at a high temperature between about 550° C. and about 600° C. for 30 min, on top of the metal silicide layer 16, a thick amorphous material layer 20 of Ti—Si—Co nitrogen is formed. On top of the amorphous material layer 20, a Ti—O—N layer 22 is formed. The amorphous material layer 20 formed at a high temperature, i.e. at a temperature higher than 500° C., may have a thickness more than 5 nm, and more likely a thickness between about 5 nm and about 10 nm, as shown in FIG. 5.

It is therefore an object of the present invention to provide a method for forming a TiN layer on top of a metal silicide layer that does not have the drawbacks or the shortcomings of the conventional method.

It is another object of the present invention to provide a method for forming a TiN layer on top of a metal silicide layer in a semiconductor structure by a suitable annealing process.

It is a further object of the present invention to provide a method for forming a TiN layer on top of a metal silicide layer in a semiconductor structure that produces an amorphous material layer of Ti—Co—Si that has a minimum thickness.

It is another further object of the present invention to provide a method for forming a TiN layer on top of a metal silicide layer in a semiconductor structure by annealing the structure in a dual-step annealing process.

It is still another object of the present invention to provide a method for forming a TiN layer on top of a metal silicide layer in a semiconductor structure by first forming a sub-stoichiometric TiN at a lower annealing temperature and then forming a stoichiometric TiN layer at a higher annealing temperature.

It is yet another object of the present invention to provide a method for forming a TiN layer on top of a metal silicide layer in a semiconductor structure by annealing the structure in a dual-step annealing process consisting of a first step of low temperature annealing at 500° C., and then a second step of high temperature annealing at 600° C.

It is still another further object of the present invention to provide a method for forming a TiN layer on top of a metal silicide layer in a semiconductor structure that forms a by-product amorphous material layer of Ti—Co—Si having a thickness of less than 5 nm.

It is yet another further object of the present invention to provide a semiconductor structure that has a TiN layer formed on top of a metal silicide layer which includes an amorphous layer of Ti—Co—Si of less than 5 nm.

SUMMARY OF THE INVENTION

In accordance with the present invention, a method for forming a TiN layer on top of a metal silicide layer in a semiconductor structure and a structure formed by the method are disclosed.

In a preferred embodiment, a method for forming a TiN layer on top of a metal silicide layer in a semiconductor structure can be carried out by the operating steps of first providing a semiconductor structure that has a metal silicide layer on top, depositing a Ti layer on top of the metal silicide layer, depositing a nitrogen-containing Ti layer on top of the Ti layer, heating the semiconductor in a forming gas or nitrogen containing environment to a first temperature not higher than 500° C. for less than 2 hours, and heating the semiconductor structure in an $N_2$-containing gas to a second temperature not lower than 500° C. for less than 2 hours to form the TiN layer.

In the method for forming a TiN layer on top of a metal silicide layer in a semiconductor structure, the metal silicide is a member selected from the group consisting of cobalt disilicide, nickel monosilicide, titanium disilicide, tungsten disilicide, tantalum disilicide and niobium disilicide. The ambient gas may be a gas selected from the group consisting of $N_2$, $NH_3$, $N_2/H_2$. The method may further include the step of heating the semiconductor structure at a first temperature between about 300° C. and about 500° C., and heating the semiconductor structure at a second temperature between about 500° C. and about 800° C. The method may further include the step of heating the semiconductor structure at a first temperature preferably between about 450° C. and about 500° C., and heating the semiconductor structure at a second temperature preferably between about 600° C. and about 650° C. The method may further include the step of heating the semiconductor structure at a first temperature of about 500° C., and then at a second temperature of about 600° C.

The method for forming a TiN layer on top of a metal silicide layer in a semiconductor structure may further include the step of heating the semiconductor structure at the first temperature for between about 15 min and about 45 min, or the step of heating the semiconductor structure at a second temperature for between about 15 min and about 45 min. The method may further include the step of heating the semiconductor structure at the first temperature for about 30 min, and heating the semiconductor structure at the second temperature for about 30 min. The method may further include the steps of forming a sub-stoichiometric TiN as a top layer at the first temperature, and forming a stoichiometric TiN layer at the second temperature.

The present invention is further directed to a semiconductor structure that has a TiN layer formed on top of a metal silicide layer which includes a semiconductor structure that has a metal silicide layer on top, an amorphous layer containing Si, Ti and Co of less than 5 nm thick on top of the metal silicide layer, and a TiN layer on top of the amorphous layer.

In the semiconductor structure that has a TiN layer formed on top of a metal silicide layer, the metal silicide is a member selected from the group consisting of cobalt disilicide, nickel monosilicide, titanium disilicide, tungsten disilicide, tantalum disilicide and niobium disilicide. The semiconductor structure may be a CMOS. The TiN layer is a stochiometric TiN formed after annealing at 600° C. for 30 min. The amorphous layer may have a thickness of about 3 nm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
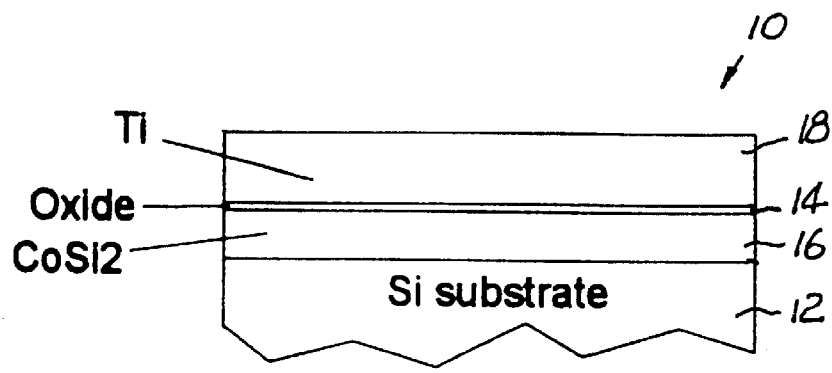
FIG. 1 is an enlarged, cross-sectional view of a conventional as-deposited sample incorporating an oxide layer between $CoSi_2$ and Ti.
Figure 2:
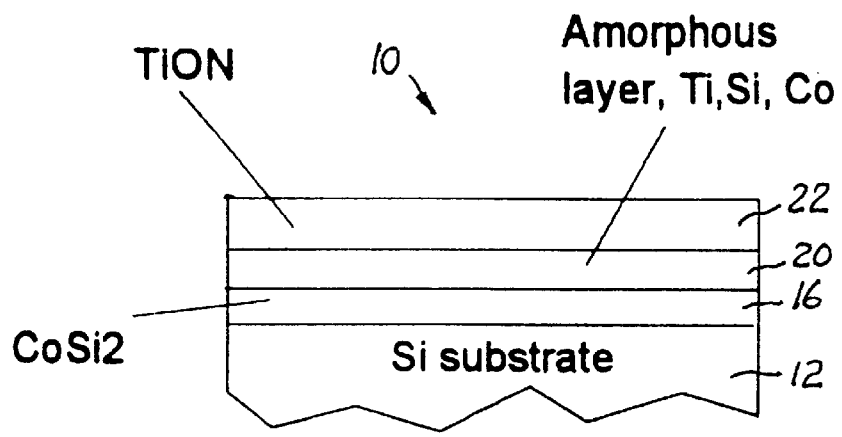
FIG. 2 is an enlarged, cross-sectional view of a conventional single-step annealed sample that was annealed at 600° C. for 30 minutes.

The present invention discloses a method for forming a TiN layer on top of a metal silicide layer in a semiconductor structure that does not have the drawbacks or shortcomings of the conventional forming methods. In the conventional forming methods, a single step annealing process is conducted at a temperature between 550° C. and 600° C. in order to form a TiN barrier layer to protect against $WF_6$ attack during a subsequent CVD W deposition. Problems occur when a 25–50 nm thick Ti layer is annealed above approximately 500° C. since Ti reacts with $CoSi_2$ to form an amorphous layer that contains primarily Ti, Co and Si. The Ti atoms are weakly bonded in the amorphous layer such that they can react with fluorine atoms from $WF_6$ during the CVD W deposition. The reaction causes a volume expansion and results in liner rupture.

In the present invention method, a two-step annealing method is used such that the thickness of the amorphous layer formed can be substantially reduced. As a result, the chances of weakly bonded Ti in the amorphous layer reacting with fluorine in $WF_6$ in a subsequent CVD W deposition process is reduced.

It has been found that in order to obtain a robust liner, it is necessary to provide a thick (30–60 nm) Ti layer on top of $CoSi_2$ which when annealed at a high temperature provides a good TiN barrier to prevent fluorine attack and to form a minimum amount of amorphous material between Ti—O—N and $CoSi_2$ A two-step annealing method is thus provided by the present invention to achieve such goal.

In the present invention method for forming a TiN layer on top of a metal silicide layer in a semiconductor structure without forming a thick amorphous layer of Ti—Co—Si, a semiconductor structure that has a metal silicide layer, such as a cobalt disilicide layer on top is first provided; a Ti layer is then deposited on top of the cobalt silicide layer; a second nitrogen-containing Ti layer is then deposited on top of the first Ti layer. The semiconductor structure is then heated in forming gas or $N_2$ containing gas to a first temperature not higher than 500° C. for less than 2 hours, or preferably to a temperature between about 450° C. and about 500° C. for between about 30 min and about 1 hour in a first annealing step. The semiconductor structure is then heated in a second annealing step in a nitrogen-containing gas to a second temperature not lower than 500° C. for less than 2 hours, and preferably to a temperature between about 600° C. and about 650° C. for a time period between about 30 min and about 1 hour to form the TiN layer. In the context of this writing, the word "about" is to mean a range of values ±10% of the average value given.

The metal silicide layer deposited on top of the semiconductor structure can be selected from any one of the silicides such as cobalt disilicide, nickel monosilicide, titanium disilicide, tungsten disilicide, tantalum disilicide and niobium disilicide. To effectively carry out the present invention two-stage annealing process, a gas ambient can be used which is selected from $N_2$, $NH_3$, $N_2/H_2$. A suitable range for the low temperature used in the first annealing step is between about 300° C. and about 500° C., and preferably between about 450° C. and about 500° C. A suitable temperature to be used as the high temperature for the second annealing step is in the range between about 500° C. and about 800° C., and preferably between about 600° C. and about 650° C. A suitable combination of the low and high temperature is a low temperature of about 500° C. and a high temperature of about 600° C. for an annealing time of about 30 min, or in a time between about 15 min and about 45 min. In the first annealing step at the low temperature, a sub-stoichiometric TiN layer is formed. In the second annealing step at high temperature, a stoichiometric TiN layer is formed.

The present invention further discloses a semiconductor structure that has a TiN layer formed on top of a metal silicide layer, i.e. a cobalt silicide layer. The structure includes a semiconductor substrate that has a cobalt silicide layer on top, an amorphous layer containing Si, Ti and Co which is less than 5 nm thick on top of the metal silicide layer, and a TiN layer on top of the amorphous layer. The semiconductor structure may be a CMOS. The TiN layer is a stoichiometric TiN material formed after annealing at 600° C. for 30 min. The amorphous layer may have a thickness of about 3 nm.

It is a discovery of the present invention that during the forming gas annealing process, Ti starts to react with N at about 400° C.–500° C. to form a sub-stoichometric TiN material. The reaction temperature required between Ti and $CoSi_2$ seems to be higher as shown by in-situ x-ray diffraction measurements. To accomplish the goal of the present invention to minimize the thickness of an amorphous layer formed, i.e. between the Ti and the $CoSi_2$ reaction, an anneal at low temperature between about 450° C. and about 500° C. is first conducted to form a sub-stoichiometric TiN layer as a top layer. After the low temperature annealing process, the film is annealed at 600° C. to form a stoichiometric or N-rich TiN layer.

Figures 4, 5:
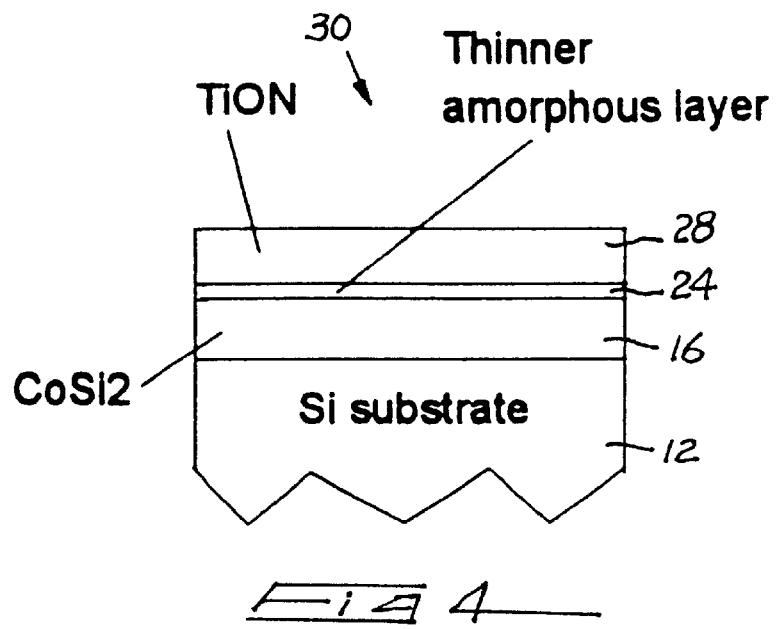
FIG. 4 is an enlarged, cross-sectional view of the present invention sample after the second step high temperature anneal at 600° C.
FIG. 5 is a table illustrates the results from a dual-step forming gas ($N_2/H_2$) annealing treatment on a 35 nm Ti film on $CoSi_2$.

The results from a dual-step forming gas ($N_2/H_2$) annealing treatment on a 35 nm Ti film on $CoSi_2$ are shown in a table in FIG. 5. It is seen that a minimum thickness of the amorphous layer of 3.2 nm is formed by a dual-step annealing method of 500° C. at 30 min and then 600° C. at 30 min. In an electron microscopy image taken on the cross-section of a sample annealed at first 400° C. and then 600° C., a layer of 29.9 nm of poly-crystalline Ti—O—N layer is formed on top of a middle layer of 8.1 nm amorphous Ti—Co—Si, while a bottom layer of 18.7 nm of $CoSi_2$ is maintained. In another electron microscopy image obtained on a sample after a dual-step annealing process carried out at 500° C. for 30 min and 600° C. for 30 min in a forming gas, the image shows an amorphous layer formed of about 3.6 nm thick. Comparing this image with the previous image obtained on samples after a dual-stage annealing at 400° C. and 600° C., it clearly indicates that the 500° C./600° C. dual step annealing process produces a better optimized process.

The present invention two-step annealing process reduces the amount of the amorphous material Ti—Co—Si formed. A possible mechanism explaining the effect of two-step annealing process is as follows. At low annealing temperatures, i.e. such as 400° C., N does not diffuse all the way to the Ti and $CoSi_2$ interface. It therefore results in a Ti and $CoSi_2$ reaction that is similar to the single step annealing in the conventional method. One solution is therefore to increase the temperature of the first annealing and to allow N to penetrate deeper into the Ti film to help prevent the reaction between Ti and $CoSi_2$ at higher temperatures. However, when the first annealing temperature is too high, Ti/$CoSi_2$ will react before N reaches the Ti/$CoSi_2$ interface. It is therefore only the novel discovery of the present invention that, a forming gas anneal treatment at 500° C. for 30 min followed by a 600° C. treatment for 30 min produces the minimum amount of amorphous layer formation and thus leading to a TiN barrier that has optimum properties.

Figure 3:
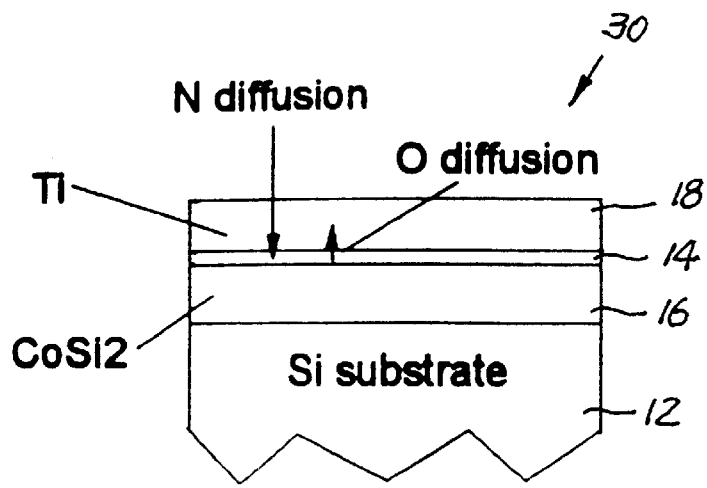
FIG. 3 is an enlarged, cross-sectional view of a present invention sample after a first step low temperature anneal at 500° C.

Referring now to FIG. 3, wherein a present invention structure 30 after a first-step low temperature annealing is shown. The structure 30 is built on silicon substrate 12 with a metal silicide layer 16, such as cobalt silicide on top. A native oxide layer 14 exists between the metal silicide layer 16 and the titanium layer 18. At the first annealing temperature between about 400° C. and about 500° C., nitrogen is allowed to diffuse to the interface between the metal silicide layer 16 and the Ti layer 18 before Ti reacts with the metal silicide layer 16. The low temperature annealing step also causes the native oxide 14 at the surface of metal silicide layer 16 to dissolve into the Ti metal layer 18.

In the second high temperature annealing step shown in FIG. 4, the structure 30 is annealed at between about 550° C. and about 600° C. in forming gas. Since most of the Ti already contains nitrogen due to the low temperature annealing, there is very little Ti left to react with the metal silicide layer or the $CoSi_2$ layer 16 at the high temperature. As a result, a substantially thinner, i.e. between about 3 nm and about 4 nm, amorphous material layer 24 that contains Ti, Co and Si is formed between the $CoSi_2$ layer 16 and the Ti—O—N layer 28.

The present invention method for forming a TiN layer on top of a metal silicide layer without forming a thick amorphous material layer of Ti—Co—Si therein has therefore been amply described in the above description and in the appended drawings of FIGS. 3–5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming a TiN layer on top of a metal silicide layer in a semiconductor structure comprising the steps of:
   providing a semiconductor structure having a metal silicide layer not formed of titanium silicide on top,
   depositing a Ti layer on top of said metal silicide layer,
   heating said semiconductor structure in a forming gas, $N_2$ or $N_2$ containing environment to a first temperature not higher than 500° C. for less than 2 hours, and
   heating said semiconductor structure in a $N_2$ containing gas to a second temperature not lower than 500° C. for less than 2 hours forming said TiN layer.

2. A method for forming a TiN layer on top of a metal silicide layer in a semiconductor structure according to claim 1, wherein said metal silicide is a member selected from the group consisting of cobalt silicide, nickel silicide, tungsten silicide, tantalum silicide and niobium silicide.

3. A method for forming a TiN layer on top of a metal silicide layer in a semiconductor structure according to claim 1, wherein said forming gas is a gas selected from the group consisting of $N_2$, $NH_3$ and $N_2/H_2$.

4. A method for forming a TiN layer on top of a metal silicide layer in a semiconductor structure according to claim 1 further comprising the step of heating said semiconductor structure at a first temperature between about 300° C. and about 500° C.

5. A method for forming a TiN layer on top of a metal silicide layer in a semiconductor structure according to claim 1 further comprising the step of heating said semiconductor structure at a second temperature between about 500° C. and about 800° C.

6. A method for forming a TiN layer on top of a metal silicide layer in a semiconductor structure according to claim 1 further comprising the step of heating said semiconductor structure at a first temperature preferably between about 450° C. and about 500° C.

7. A method for forming a TiN layer on top of a metal silicide layer in a semiconductor structure according to claim 1 further comprising the step of heating said semiconductor structure at a second temperature preferably between about 600° C. and about 650° C.

8. A method for forming a TiN layer on top of a metal silicide layer in a semiconductor structure according to claim 1 further comprising the step of heating said semiconductor structure at a first temperature of about 500° C. and at a second temperature of about 600° C.

9. A method for forming a TiN layer on top of a metal silicide layer in a semiconductor structure comprising the steps of:
   providing a semiconductor structure having a metal silicide layer on top,
   depositing a Ti layer on top of said metal silicide layer,
   depositing a N-containing Ti layer on top of said Ti layer,
   heating said semiconductor structure in a forming gas, $N_2$ or $N_2$ containing environment to a first temperature not higher than 500° C. for between about 15 min and about 45 min, and
   heating said semiconductor structure in a $N_2$- containing gas to a second temperature not lower than 500° C. for less than 2 hours forming said TiN layer.

10. A method for forming a TiN layer on top of a metal silicide layer in a semiconductor structure comprising the steps of:
   providing a semiconductor structure having a metal silicide layer on top,
   depositing a Ti layer on top of said metal silicide layer,
   depositing a N-containing Ti layer on top of said Ti layer,
   heating said semiconductor structure in a forming gas, $N_2$ or $N_2$ containing environment to a first temperature not higher than 500° C. for less than 2 hours, and
   heating said semiconductor structure in a $N_2$- containing gas to a second temperature not lower than 500° C. for between about 15 min and about 45 min forming said TiN layer.

11. A method for forming a TiN layer on top of a metal silicide layer in a semiconductor structure according to claim 1 further comprising the step of heating said semiconductor structure at said first temperature for about 30 min and heating said semiconductor structure at said second temperature for about 30 min.

12. A method for forming a TiN layer on top of a metal silicide layer in a semiconductor structure according to claim 1 further comprising the steps of forming a sub-stoichiometric TiN as a top layer at said first temperature, and forming a stoichiometric TiN layer at said second temperature.

13. A semiconductor structure having a TiN layer formed on top of a metal silicide layer comprising:
   a semiconductor structure having a metal silicide layer on top,
   an amorphous layer containing Si, Ti and Co of less than 5 nm thick on top of said metal silicide layer, and
   a TiN layer on top of said amorphous layer.

14. A semiconductor structure having a TiN layer formed on top of a metal silicide layer according to claim 13, wherein said metal silicide is a member selected from the group consisting of cobalt silicide, nickel silicide, titanium silicide, tungsten silicide, tantalum silicide and niobium silicide.

15. A semiconductor structure having a TiN layer formed on top of a metal silicide layer according to claim 13, wherein said semiconductor structure is a CMOS.

16. A semiconductor structure having a TiN layer formed on top of a metal silicide layer according to claim 13, wherein said TiN layer is a stoichiometric TiN formed after annealing at 600° C. for 30 min.

17. A semiconductor structure having a TiN layer formed on top of a metal silicide layer according to claim 13, wherein said amorphous layer having a thickness of about 3 nm.

* * * * *